(12) United States Patent
Chaudhry (10) Patent No.: US 7,091,075 B2
(45) Date of Patent: *Aug. 15, 2006

(54) FABRICATION OF AN EEPROM CELL WITH SIGE SOURCE/DRAIN REGIONS

(75) Inventor: Muhammad I. Chaudhry, Colorado Springs, CO (US)

(73) Assignee: Atmel Corporation, San Jose, CA (US)

( * ) Notice: Subject to any disclaimer, the term of this patent is extended or adjusted under 35 U.S.C. 154(b) by 18 days.

This patent is subject to a terminal disclaimer.

(21) Appl. No.: 10/887,990

(22) Filed: Jul. 9, 2004

(65) Prior Publication Data

US 2006/0008960 A1    Jan. 12, 2006

(51) Int. Cl.
*H01L 21/336* (2006.01)
(52) U.S. Cl. .................... 438/197; 438/202
(58) Field of Classification Search ............ 438/197
See application file for complete search history.

(56) References Cited

U.S. PATENT DOCUMENTS

| | | | |
|---|---|---|---|
| 5,698,869 A | 12/1997 | Yoshimi et al. ............ 257/192 |
| 6,313,487 B1 | 11/2001 | Kencke et al. ............. 257/192 |
| 6,411,548 B1 | 6/2002 | Sakui et al. ........... 365/185.17 |
| 6,664,589 B1 * | 12/2003 | Forbes et al. ............... 257/328 |
| 6,875,648 B1 * | 4/2005 | Chaudhry .................... 438/202 |
| 6,888,739 B1 * | 5/2005 | Forbes ....................... 365/149 |
| 2002/0098648 A1 | 7/2002 | Ludwig et al. ............. 438/257 |

* cited by examiner

*Primary Examiner*—Thao P. Le
(74) *Attorney, Agent, or Firm*—Schneck & Schneck; Thomas Schneck (57) ABSTRACT

An EEPROM memory cell uses silicon-germanium/silicon and emitter polysilicon film for fabricating shallow source/drain regions to increase a breakdown voltage with respect to a well. The source/drain regions are fabricated to be approximately 100 nm (0.1 micrometers (μm)) in depth with a breakdown voltage of approximately 14 volts or more. A typical breakdown voltage of a well in a bipolar process is approximately 10 volts. Due to the increased breakdown voltage achieved, EEPROM memory cells can be produced along with bipolar devices on a single integrated circuit chip and fabricated on a common semiconductor fabrication line.

26 Claims, 7 Drawing Sheets

FABRICATION OF AN EEPROM CELL WITH SIGE SOURCE/DRAIN REGIONS

TECHNICAL FIELD

The present invention relates to integrated circuit fabrication. More specifically, the present invention relates to an apparatus and method of fabrication of electrically programmable storage cells with source/drain diffusions that allow high level programming voltages.

BACKGROUND ART

Semiconductor memory devices are typically classified into volatile memory devices and non-volatile memory devices. Volatile memory devices are subdivided into dynamic random access memories (DRAMs) and static random access memories (SRAMs). Non-volatile memory types include mask read-only memories (MROMs), programmable read-only memories (PROMs), erasable programmable read-only memories (EPROMs), and electrically erasable programmable read-only memories (EEPROMs). Additionally, flash EEPROMs are advantageous as mass storage devices because their integration density is high compared with conventional EEPROMs.

Non-volatile semiconductor memories have attained broad utilization due to an ability to retain data within a device, even after power has been suspended. EEPROMs are non-volatile semiconductor memories that posses these abilities and additionally are able to store data by electrically erasing and writing storage devices. This programming process can be repeated over hundreds and thousands of cycles.

Frequently, it would be convenient to be able to mix integrated circuit device types, such as EEPROMs with other memory devices or bipolar and MOSFET (BiCMOS) circuits onto a single integrated circuit chip. However, due to the inherently low breakdown voltage (approximately 10 volts or less) of the typical wells used in these devices and the need for a high programming voltage of a flash memory device (approximately 11 to 15 volts), there has been no simple and economical way to integrate these two device types into a single integrated circuit.

DISCLOSURE OF INVENTION

The present invention relates to an EEPROM memory cell that uses a silicon-germanium/silicon (SiGe/Si) film or alternatively, a SiGe/Si film in combination with an emitter polysilicon (Epoly) film for fabricating shallow CMOS source/drain regions or bipolar emitter regions to increase a breakdown voltage of the wells. The source/drain and emitter regions are fabricated to be approximately 100 nanometers (nm) or 0.1 micrometers ($\mu$m) in depth with a breakdown voltage with respect to a well of approximately 14 volts or more. Typical dopant concentrations for an n-type lightly doped diffusion (NLDD) is $1E17/cm^3$, for a p-type lightly doped diffusion (PLDD) is $1E18/cm^3$, and for a buried $n^+$ dopant region ($BN^+$) is $5E17/cm^3$. A typical well depth is approximately 3 $\mu$m.

Within a combined Bipolar-Complementary Metal Oxide Semiconductor (BiCMOS) process, conventional source/drain diffusions are relatively deep, approximately 0.2 micrometers. This depth of source/drain diffusions means less separation is available for depletion layer isolation from the well than that provided by the shallow source/drain diffused regions of the present invention. A typical breakdown voltage of a well in a BiCMOS process is approximately 10 volts. Due to the increased breakdown voltage achieved with the present invention, EEPROM memory cells can be produced in wells used in the BiCMOS process.

The present invention is a method of fabricating an integrated circuit by producing an n-well into an uppermost surface of a semiconductor substrate, doping a source dopant region and a drain dopant region, and doping a combination drain/source dopant region. The well and doped regions are all fabricated within an uppermost surface of the semiconducting substrate. The drain and source dopant regions, and the combination drain/source dopant region are all doped with acceptor sites. A portion of a gate region is also doped to have a higher concentration of acceptor sites than either of the drain or source dopant regions or the combination drain/source region. The gate region is doped to be electrically coupled to the drain region in order to facilitate programming of the memory transistor of the EEPROM cell. Silicon-germanium and then polysilicon are deposited over the source dopant region and the drain dopant region to form epitaxial silicon-germanium/silicon regions. The silicon-germanium/silicon regions are fabricated with a higher acceptor concentration that either the drain or the source dopant regions or the combination drain/source region. At least one PMOS transistor is fabricated from the source and combination drain/source dopant regions, and the PMOS transistor is configured to serve as a select transistor in a memory cell. At least one additional PMOS transistor is fabricated from the drain and the combination drain/source dopant regions, with the additional PMOS transistor configured to serve as a memory transistor in the memory cell.

Additionally, the present invention is also a method of fabrication of an EEPROM cell having PMOS and NMOS transistors that have similar benefits to those of the at least two PMOS transistor version described supra. In a manner similar to that described supra, an integrated circuit is fabricated by producing an n-well into a portion of an uppermost surface of a semiconductor substrate. Additionally, a p-well is produced into at least a portion of the remaining extent of the uppermost surface of the semiconductor substrate. Doping a first source dopant region and a first drain dopant region in the n-well forms a select transistor. Doping a second source dopant region and a second drain dopant region in the p-well forms a memory transistor. The first dopant regions are acceptor sites and the second dopant regions are donor sites. A portion of a gate region within the p-well is also doped. The gate region has a higher concentration of donor sites than either the second drain or the second source region. The gate region is doped to be electrically coupled to the second drain region in order to facilitate programming of the memory transistor of the EEPROM cell.

The present invention is also an electronic integrated circuit fabricated onto a single integrated circuit chip. The integrated circuit chip includes a first field effect transistor (FET) configured as a select transistor, a second FET configured to operate as a memory transistor and coupled to the first transistor, and at least one NPN or PNP transistor. The second FET is configured to have a programming voltage of about 9 to 15 volts. For a PMOS memory transistor with a PMOS select transistor, the programming voltage is about 12 to 15 volts. For an NMOS memory transistor with a PMOS select transistor, the programming voltage is about 9 to 11 volts. The first FET and the second FET are configured to operate as an EEPROM cell.

BEST MODE FOR CARRYING OUT THE INVENTION

An electronic memory device of the present invention has source/drain junctions with a relatively high (e.g., about 14 volts or approximately 12–15 volts) breakdown voltage with respect to a well for a PMOS-PMOS type memory cell. The breakdown voltage of a well on a typical bipolar process is only about 10 volts. A lower well breakdown voltage is attributed to a deep (e.g., approximately 200 nm or greater (0.2 μm)) source/drain doped region. For a PMOS select device and an NMOS memory device a programming voltage of approximately 9–11 volts is produced. Using a silicon-germanium/silicon film of the present invention to fabricate source/drain regions of an MOS device results in shallow junctions and a resulting higher breakdown voltage. Therefore, the high breakdown voltage allows the present invention to be fabricated in an integrated CMOS/Bipolar (i.e., BiCMOS) line, allowing both EEPROM and BiCMOS devices to be formed in an integrated circuit.

Figure 1:
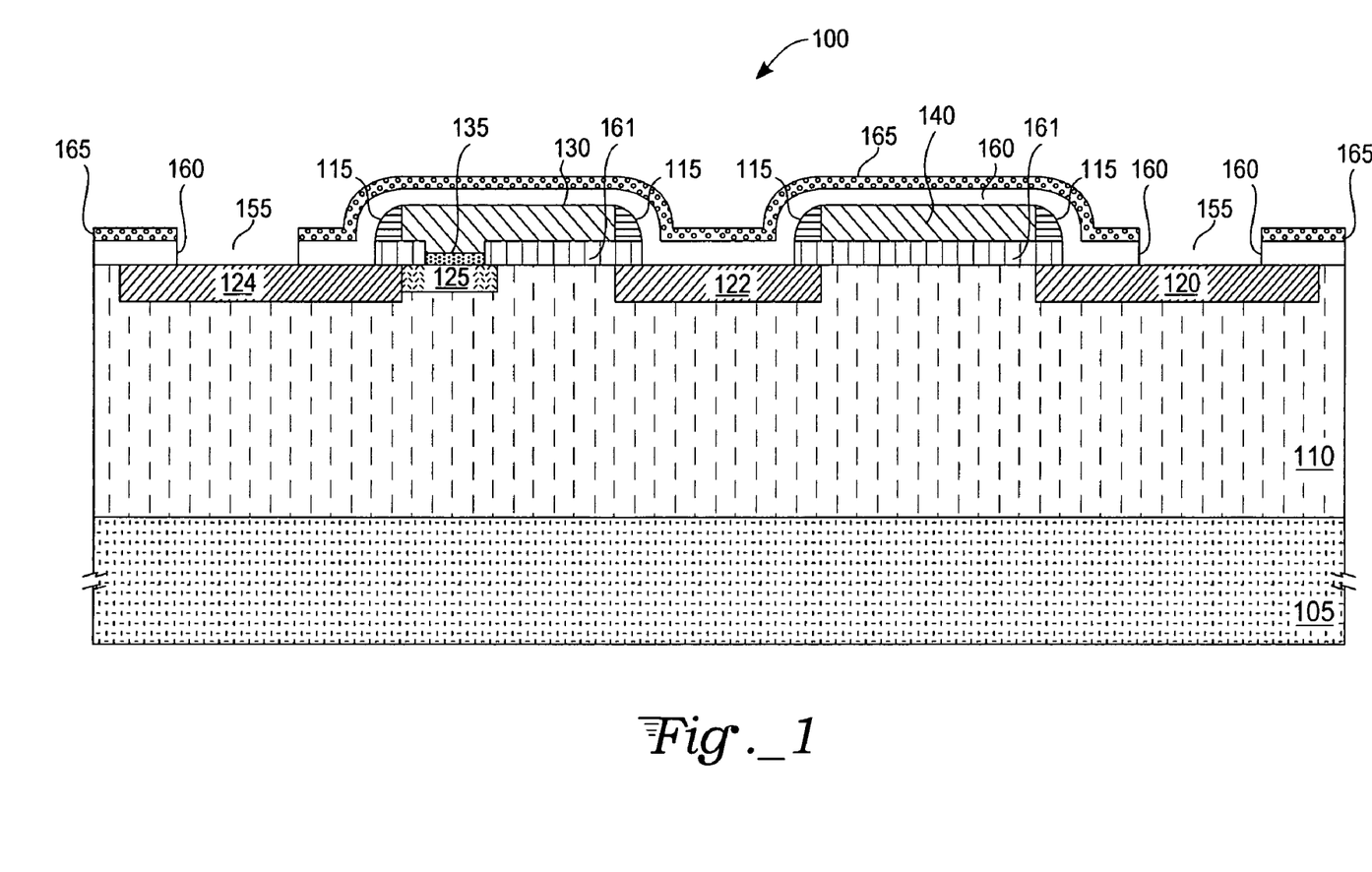
FIG. 1 shows a cross-section of a PMOS-PMOS EEPROM storage cell with SiGe film application windows exposed.

With respect to FIGS. 1–7, exemplary embodiments of the present invention are described according to the following process steps. FIG. 1 includes a cross-section 100 of doped regions used to create electronic device structures such as an EEPROM cell and an NPN transistor. FIG. 1 further includes a base substrate 105, a doped n-well 110, a lightly doped memory transistor drain doped region 124, a memory transistor gate doped region 125, a lightly-doped drain/source doped region 122, and a lightly-doped select transistor source doped region 120. Processes well known to one of skill in the art form all doped regions. Alternatively, the n-well 110 may be an epitaxial deposition layer with n-type doping.

The base substrate 105 is frequently a silicon wafer. In this embodiment, the silicon wafer contains a p-type dopant. Alternatively, another elemental group IV semiconductor or compound semiconductor (e.g., groups III–V or II–VI) may be selected for base substrate 105. For a p-type silicon base substrate 105, the epitaxial deposition layer and an implant form an n-well 110 containing a donor-type dopant. The memory transistor drain doped region 124 and the drain/source doped region 122 are implanted with a p-type dopant and the memory transistor gate doped region 125 is a buried p-type (p+). The memory transistor gate doped region 125 is used to form a bottom plate of a coupling capacitor and a heavily-doped region for an overlying tunnel diode window (TDW), discussed in more detail infra.

In a specific exemplary embodiment, the memory drain doped region 124, the memory gate doped region 125, the drain/source doped region 122, and the select source doped region 120 are all produced by an ion implantation step followed by a drive-in step (e.g., by rapid thermal annealing (RTA)) to have a junction depth of approximately 100 nm (0.1 μm).

FIG. 1 further includes a cross-section of a film stack applied over the dopant regions. The film stack includes a gate oxide layer 161, a tunnel diode window (TDW) 135, a memory transistor gate polysilicon layer 130 and a select transistor gate polysilicon layer 140. The gate oxide layer 161 is either thermally grown or deposited, for example, by chemical vapor deposition (CVD). After the gate oxide layer 161 is grown or deposited, and prior to deposition of the polysilicon layer 130, an opening is made in the gate oxide layer 161 to form, inter alia, the TDW 135. The opening is made by applying a photoresist layer (not shown), photolithographically exposing the photoresist layer, and developing and etching the photoresist layer to form an etch mask for the TDW 135. Subsequently, the TDW 135 may be etched through various etching techniques, such as a wet etch (e.g., a hydrofluoric acid etch, such as contained in a standard buffered oxide etch, or orthophosphoric acid) or dry etch (e.g., reactive-ion etch (RIE)) techniques. A brief thermal oxidation step is performed to grow a thin tunnel oxide of the TDW 135.

In a specific exemplary embodiment, the gate oxide layer 161 is thermally grown and is 18 nm–20 nm (180 Å–200 Å) thick and the oxide of the TDW 135 is 7 nm (70 Å) thick.

With further reference to FIG. 1, the polysilicon layer is patterned by exposing, developing, and etching an overlaying photoresist layer (not shown), and etching the polysilicon layer, techniques well known to one skilled in the art. After etching, the polysilicon layer forms a memory transistor gate polysilicon area 130 and a select transistor gate polysilicon area 140.

A nitride layer (not shown) is deposited over the memory transistor gate polysilicon area 130 and the select transistor gate polysilicon area 140. The nitride layer is patterned and dry etched (e.g., by RIE) forming nitride spacers 115 surrounding the gate polysilicon areas 130 and 140. Depending on a selectivity of an etchant chosen for use in the RIE process, there may be some over-etching of the nitride layer and into the gate oxide layer 161. If the process contemplates integrated CMOS/Bipolar technologies, discussed supra, formation of the nitride spacers 115 ends the CMOS process steps.

The bipolar device formation process begins with a deposition of a CVD oxide 160 and a second polysilicon layer 165. A photoresist layer (not shown) overlaying the CVD oxide 160 and the second polysilicon layer 165, is exposed, developed, and etched. The etched photoresist layer serves as an etch mask for etching the CVD oxide 160 and the second polysilicon layer 165, producing silicon-germanium (SiGe) windows 155.

Figure 2:
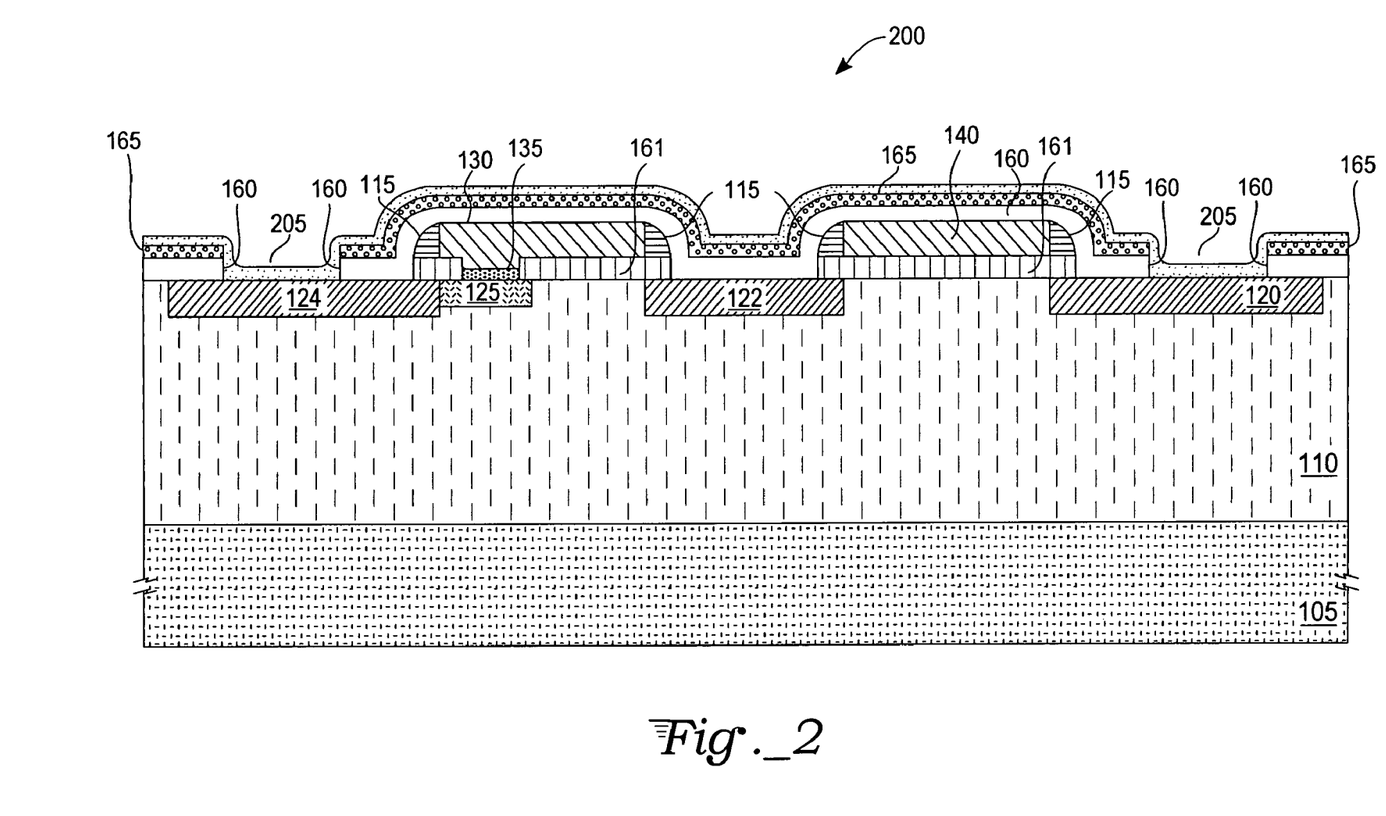
FIG. 2 shows a cross-section of a PMOS-PMOS EEPROM storage cell with SiGe film applied.

With reference to FIG. 2, a SiGe/Si film 205 is deposited into the SiGe windows (i.e., over the memory transistor drain doped region 124 and the select transistor source doped region 120 (FIG. 1)) and onto surrounding regions.

Figure 3:
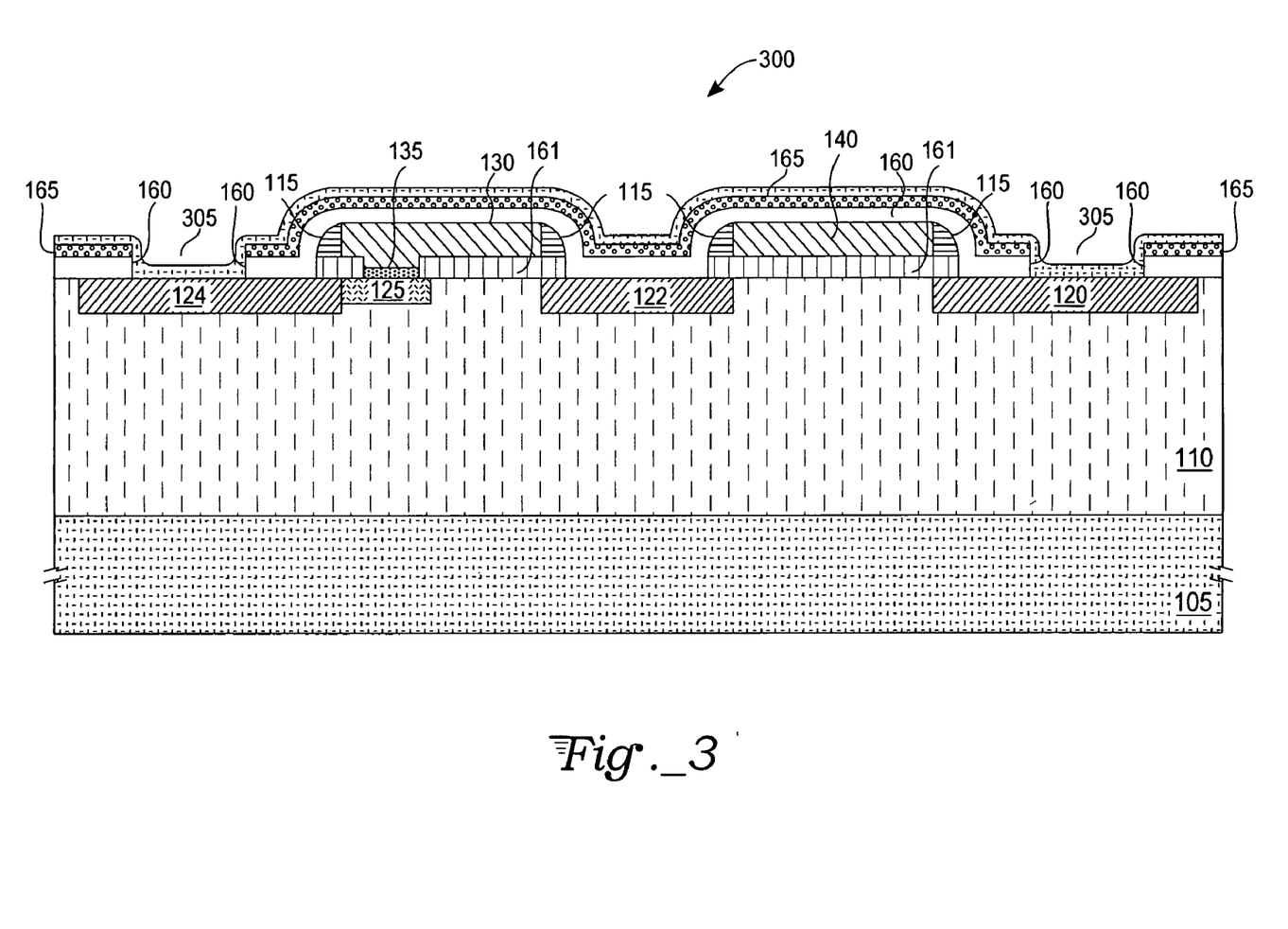
FIG. 3 shows a cross-section of a PMOS-PMOS EEPROM storage cell with SiGe film wherein the SiGe film is doped with a high concentration of boron.

With regard to FIG. 3, the SiGe/Si film 205 is doped, for example, with boron, producing a doped SiGe/Si film 305.

The doping is followed by applying an additional photoresist layer (not shown). Photolithographic exposure, development, and etching of the photoresist and underlying SiGe/Si film 305 produces, inter alia, the source/drain contact regions 457 (FIG. 4) for the memory and select devices.

Figure 4:
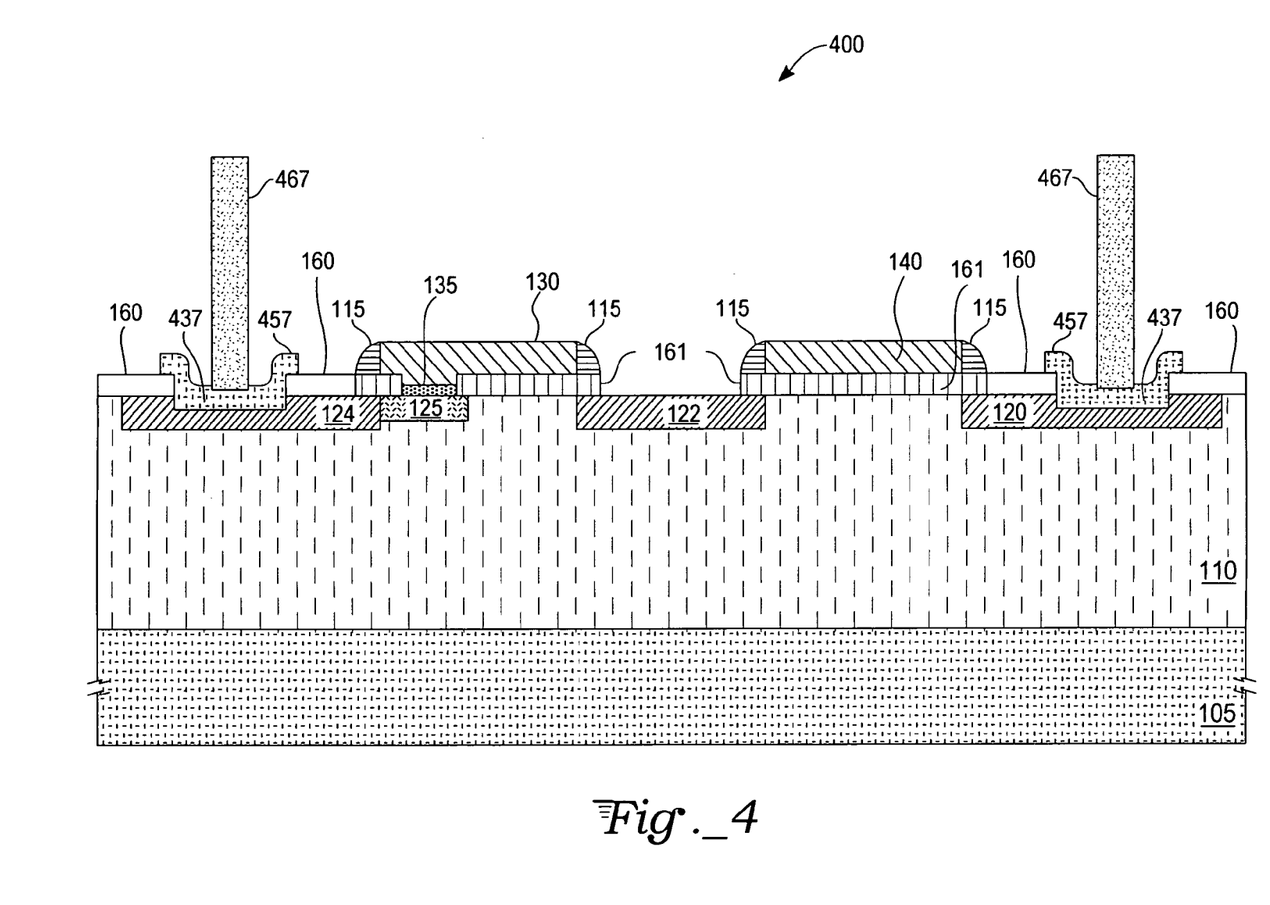
FIG. 4 shows a cross-section of a PMOS-PMOS EEPROM storage cell with SiGe film and boron diffused into source/drain regions and metal contacts applied.

With regard to FIG. 4, the boron implant film 305 is etched and forms a shallow doped region 437 within the source/drain contact dopant regions 457. These shallow doped regions have an acceptor concentration higher than that of the surrounding doping of the drain doped region 124 and the source doped region 120. This high acceptor concentration at a shallow depth produces a characteristic of high breakdown voltage with respect to the well of the present invention. This is accomplished by the shallow doping of high concentration 437 at each contact dopant region 457 allowing greater separation for forming a depletion layer isolation from the doped n-well 110.

With further reference to FIG. 4, metallic contacts 467 are formed to couple to the source/drain contact regions 457. Processes well known to a skilled artisan form the metallic contacts 467. The processes briefly involve, for example, depositing a CVD dielectric layer over the existing structures, patterning and etching vias in the dielectric (one above each source/drain contact region 457), depositing a titanium nitride (TiN) or titanium (Ti) liner on interior walls of the via, and depositing a tungsten (W) or copper (Cu) plug within each lined via.

Figure 5:
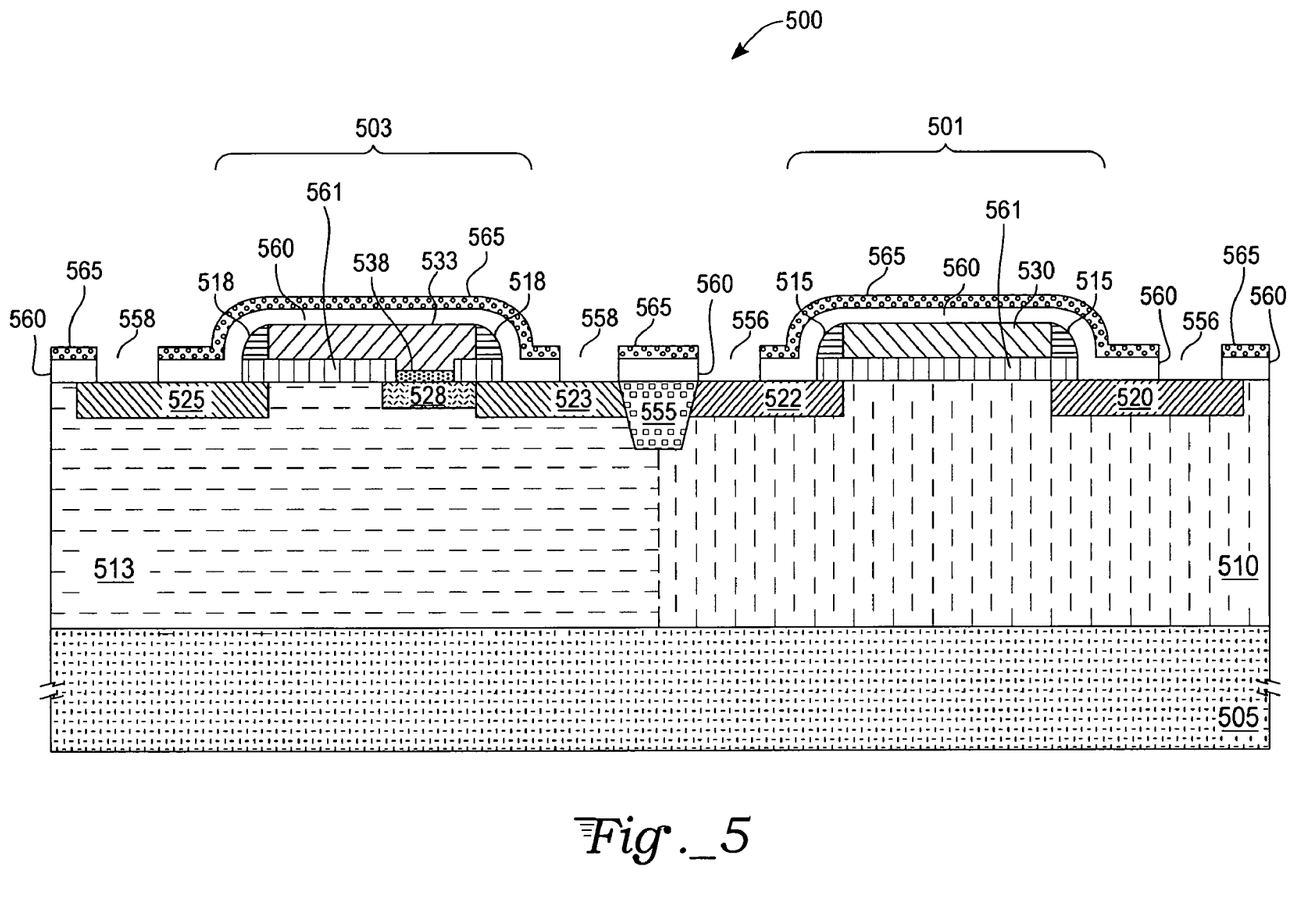
FIG. 5 shows a cross-section of a PMOS-NMOS EEPROM storage cell with film application windows exposed.

With regard to FIG. 5 an EEPROM memory cell has a PMOS transistor 501 used as a select device and an NMOS transistor 503 as a memory device. The PMOS transistor is formed from a polysilicon gate 530 along with a doped source region 520 and a doped drain region 522 within an n-well region 510. The n-well region is applied upon an epitaxially layer (not shown) which is grown upon a lightly doped (e.g., $7E14/cm^3$, p-type) semiconductor substrate 505 material. The NMOS transistor 503 resides within a p-type well (p-well) 513 and is isolated from the n-well 510 and the PMOS transistor. A shallow trench isolation (STI) structure 555 is used for this electrical separation.

The NMOS transistor 503 formation of the memory device is similar to the PMOS formation of a memory transistor described supra. Briefly, the structure of the NMOS memory transistor 503 is a source doped region 525, a drain doped region 523, a gate doped region 528 coupled to the drain doped region 523 forming a bottom plate of a TDW 538, a polysilicon gate 533, a gate oxide 561, and nitride spacers 518 surrounding the polysilicon gate 533.

Similar to the fabrication of the PMOS-PMOS EEPROM cell (FIGS. 1–4), described supra, the PMOS-NMOS structure is covered with a film of CVD oxide 560 and a second polysilicon layer 565. A photoresist layer (not shown) overlaying the CVD oxide 560 and the second polysilicon layer 565, is exposed, developed, and etched. The etched photoresist layer serves as an etch mask for etching the CVD oxide 560 and the second polysilicon layer 565, producing a first SiGe window 556 for the PMOS transistor 501 and a second SiGe window 558 over the NMOS memory transistor 503 for either a SiGe film or an emitter polysilicon film, to be described infra.

Figure 6:
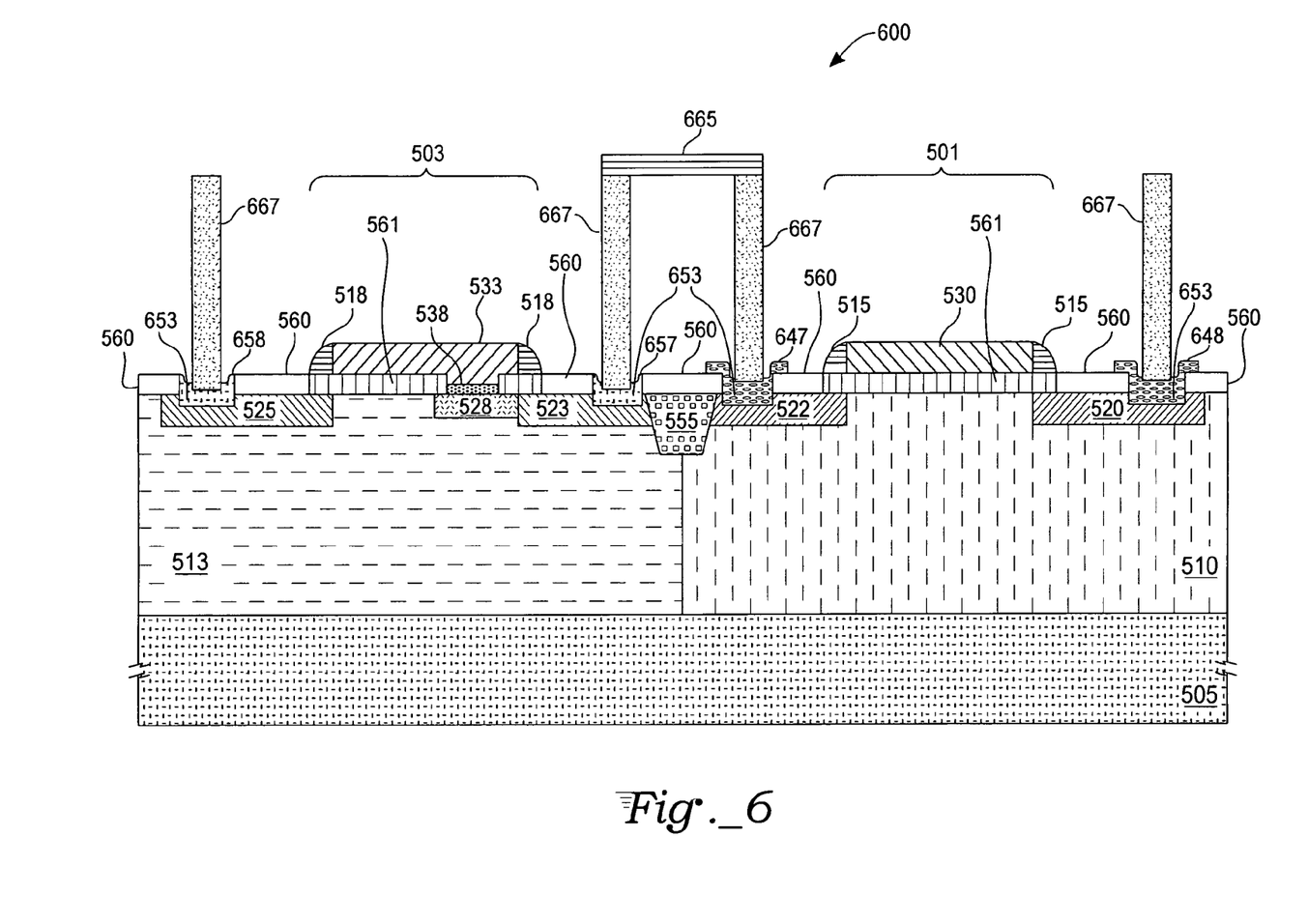
FIG. 6 shows a cross-section of a PMOS-NMOS EEPROM storage cell with SiGe film application in a PMOS select device and an NMOS storage device utilizing standard n-type source/drain region diffusions.

With reference to FIG. 6, an exemplary embodiment of a PMOS-NMOS EEPROM storage cell has SiGe windows 556, 558 (FIG. 5) deposited with a SiGe/Si film. The PMOS transistor 501 is doped with a high concentration of p-type material, for example boron, into the source region 648 and drain region 647. The NMOS transistor 503 is doped with a high concentration of n-type material, for example arsenic, into the source region 658 and drain region 657. As with the PMOS-PMOS embodiment (FIGS. 1–4), discussed supra, a shallow high concentration region 653 is formed within the source/drain doped regions 647, 648, 657, and 658, which comes from the high concentration dopants of the applied films (not shown). This high concentration at a shallow depth produces the characteristic of high breakdown voltage with respect to the wells 510, 513 of the present invention.

Figure 7:
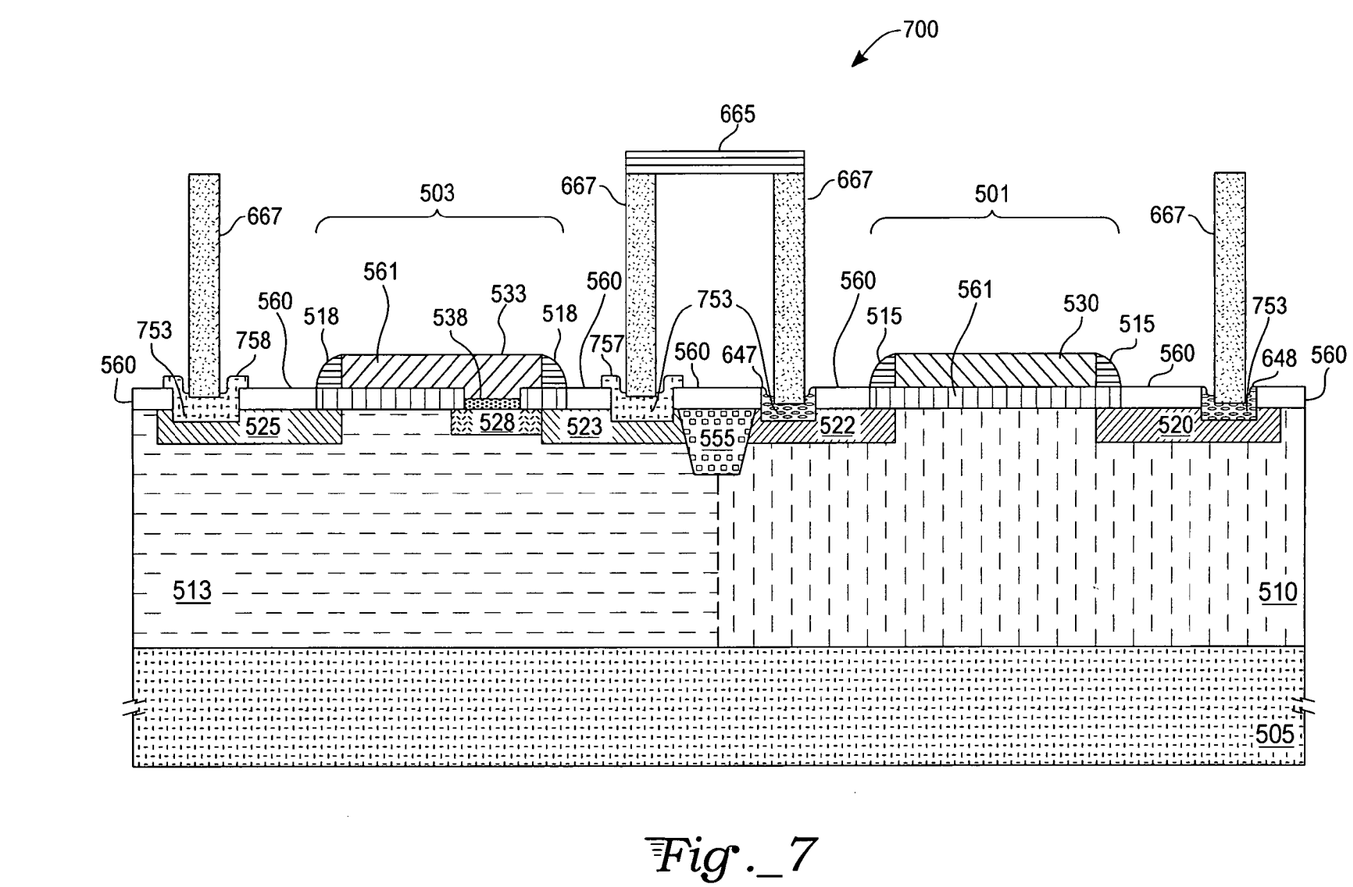
FIG. 7 shows a cross-section of a PMOS-NMOS EEPROM storage cell with SiGe film application in a PMOS select device and an NMOS storage device utilizing n-Epoly source/drain regions.

In reference to FIG. 7, another exemplary embodiment of a PMOS-NMOS EEPROM storage cell has the SiGe windows 556 (FIG. 5) deposited with a SiGe/Si film. The PMOS transistor 501 is doped with a high concentration of p-type material, for example boron, over the source region 648 and drain region 647. The windows over the NMOS source/drain 558 (FIG. 5) are e-poly windows wherein an emitter polysilicon film (not shown) is applied and doped, for example, with a high concentration of arsenic, followed by applying an additional photoresist layer (not shown). A shallow high concentration region 753 is formed within the source/drain doped regions 647, 648, 757, and 758, which comes from the high concentration dopants of the applied films. This high concentration at a shallow depth produces the characteristic of high breakdown voltage with respect to the wells 510, 513 of the present invention. Photolithographic exposure, development, and etching of the photoresist and underlying emitter polysilicon film produces, inter alia, the source contact region 758 and the drain contact region 757 of the NMOS transistor 503.

Metallization steps (not shown), known to one of skill in the art, will provide actual connection terminals in later process steps for the CMOS and bipolar devices. Following the completion of major processing steps referenced in FIGS. 4, 6, and 7, techniques well known to a skilled artisan are used to perform, for example, additional metallization, electronic-test, and packaging steps to complete the semiconductor memory cell device and one or more bipolar devices. Bipolar devices, for example, are formed by stacking SiGe and emitter poly films over an n-well region. The SiGe and emitter poly films form the base and emitter, respectively. An n-well region forms the collector of an npn device, for instance.

Although process steps and techniques are shown and described in some detail, a skilled artisan will recognize that other techniques and methods may be utilized which are still included within a scope of the present invention. For example, there are frequently several techniques used for depositing a film layer (e.g., chemical vapor deposition, plasma-enhanced vapor deposition, epitaxial deposition, atomic layer deposition, etc.). Although not all techniques are amenable to all film types described herein, one skilled in the art will recognize that multiple methods for depositing a given layer and/or film type may be used. Additionally, various techniques may be used to dope regions in a semiconductor. Although implantation has been described in the exemplary embodiments, one skilled in the art realizes that other doping procedures, such as diffusion, could be substituted or combined with the implantation procedures described herein. Further, the overall layout has been described in terms of horizontally disposed CMOS and bipolar devices. However, a skilled artisan will recognize the present invention disclosed is readily applicable to a formation of vertically disposed devices as well. Therefore, the scope of the present invention shall only be limited by a scope of the appended claims.

What is claimed is:

1. A method of fabricating an integrated circuit comprising:

producing an n-well into an uppermost surface of a semiconducting substrate;

doping a source dopant region, a drain dopant region, and a combination drain/source dopant region into the uppermost surface of the semiconducting substrate, the drain dopant region, the source dopant region, and the combination drain/source dopant region being lightly doped acceptor sites;

doping a gate dopant region coupled to the drain dopant region, the gate dopant region having a higher concentration of acceptor sites than either of the dopant regions or the drain/source dopant region;

depositing a floating gate region in proximity to the gate dopant region, the floating gate region configured as a floating programming gate;

depositing silicon-germanium and silicon over the source dopant region and the drain dopant region to form epitaxial silicon-germanium/silicon regions, the silicon-germanium/silicon regions having a higher acceptor concentration than either of the dopant regions or the drain/source dopant region;

fabricating a PMOS transistor from the source dopant region and the combination drain/source dopant region, the PMOS transistor configured to serve as a select transistor in a memory cell;

fabricating a PMOS transistor from the drain dopant region, the gate dopant region, the combination drain/source dopant region, and the floating gate region, the PMOS transistor configured to serve as a memory transistor in the memory cell; and fabricating at least one bipolar device in the integrated circuit, the at least one bipolar device being in electrical communication with the select transistor and the memory transistor and having a breakdown voltage sufficient to withstand a programming voltage of the memory cell.

2. The method of fabricating the integrated circuit of claim 1, wherein depositing an epitaxial layer on the uppermost surface of the semiconducting substrate produces the n-well, the epitaxial layer is doped so as to have a higher concentration of donor sites than a concentration of dopant sites of the semiconducting substrate.

3. The method of fabricating the integrated circuit of claim 1, wherein the n-well is produced by doping at least a portion of the uppermost surface of the semiconducting substrate so as to have a higher concentration of donor sites than a concentration of dopant sites of the semiconducting substrate.

4. The method of fabricating the integrated circuit of claim 1 further comprising producing collector, base, and emitter regions for at least one NPN or PNP transistor from the silicon-germanium/silicon regions.

5. The method of fabricating the integrated circuit of claim 1 further comprising a tunnel diode window, wherein the tunnel diode window is located in proximity to the doped gate dopant region and an oxide in the tunnel diode window is about 7 nanometers in thickness.

6. The method of fabricating the integrated circuit of claim 1, wherein the source dopant region, the drain dopant region, the combination drain/source dopant region, and the gate dopant region are all doped to a depth of about 100 nm.

7. A method of fabricating an integrated circuit comprising:

producing an n-well onto an uppermost surface of a semiconducting substrate, the n-well being produced by depositing an epitaxial layer on the uppermost surface of the semiconducting substrate, the epitaxial layer is doped so as to have a higher concentration of donor sites than a concentration of dopant sites of the semiconducting substrate;

doping a source dopant region, a drain dopant region, and a combination drain/source dopant region into the n-well, the source dopant region, the drain dopant region, and the combination drain/source dopant region being lightly doped acceptor sites;

doping a gate dopant region coupled to the drain dopant region, the gate dopant region having a higher concentration of acceptor sites than either of the dopant regions or the drain/source dopant region;

depositing a floating gate region in proximity to the gate dopant region, the floating gate region configured as a floating programming gate;

depositing silicon-germanium and silicon over the source dopant region and the drain dopant region to form epitaxial silicon-germanium/silicon regions, the silicon-germanium/silicon regions having a higher acceptor concentration than either of the dopant regions or the drain/source dopant region;

fabricating a PMOS transistor from the source dopant region and the combination drain/source dopant region, the PMOS transistor configured to serve as a select transistor in a memory cell;

fabricating a PMOS transistor from the drain dopant region, the gate dopant region, the combination drain/source dopant region, and the floating gate region, the PMOS transistor configured to serve as a memory transistor in the memory cell; and producing collector, base, and emitter regions from the silicon-germanium/silicon regions for at least one NPN or PNP transistor in electrical communication with the select transistor and the memory transistor.

8. The method of fabricating the integrated circuit of claim 7, wherein the source dopant region, the drain dopant region, the combination drain/source dopant region, and the gate dopant region are all doped to a depth of about 100 nm.

9. A method of fabricating an integrated circuit comprising:

producing an n-well into an uppermost surface of a semiconducting substrate, the n-well being produced by doping at least a portion of the uppermost surface of the semiconducting substrate so as to have a higher concentration of donor sites than a concentration of dopant sites of the semiconducting substrate;

doping a source dopant region, a drain dopant region, and a combination drain/source dopant region into the uppermost surface of the semiconducting substrate, the source dopant region, the drain dopant region, and the combination drain/source dopant region being lightly doped acceptor sites;

doping a gate dopant region coupled to the drain dopant region, the gate dopant region having a higher concentration of acceptor sites than either of the dopant regions or the drain/source dopant region;

depositing a floating gate region in proximity to the gate dopant region, the floating gate region configured as a floating programming gate;

depositing silicon-germanium and silicon over the source dopant region and the drain dopant region to form epitaxial silicon-germanium/silicon regions, the silicon-germanium/silicon regions having a higher acceptor concentration than either of the dopant regions or the drain/source dopant region;

fabricating a PMOS transistor from the source dopant region and the combination drain/source dopant region, the PMOS transistor configured to serve as a select transistor in a memory cell;

fabricating a PMOS transistor from the drain dopant region, the gate dopant region, the combination drain/source dopant region, and the floating gate region, the PMOS transistor configured to serve as a memory transistor in the memory cell; and producing collector, base, and emitter regions from the silicon-germanium/silicon regions for at least one NPN or PNP transistor in electrical communication with the select transistor and the memory transistor.

10. The method of fabricating the integrated circuit of claim 9, wherein the source dopant region, the drain dopant region, the combination drain/source dopant region, and the gate dopant region are all doped to a depth of about 100 nm.

11. A method of fabricating an integrated circuit comprising:

producing a p-well and an n-well into an uppermost surface of a semiconducting substrate;

doping a first source dopant region and a first drain dopant region into the uppermost surface of a semiconducting substrate within the n-well, the first drain dopant region and the first source dopant region being lightly doped acceptor sites;

doping a second source dopant region and a second drain dopant region into the uppermost surface of a semiconducting substrate within the p-well, the second drain dopant region and the second source dopant region being lightly doped donor sites;

doping a gate dopant region within the p-well and coupled to the second drain dopant region, the gate dopant region having a higher concentration of donor sites than either of the second dopant regions;

depositing a floating gate region in proximity to the gate dopant region, the floating gate region configured as a floating programming gate;

depositing silicon-germanium and silicon over the first source dopant region and the first drain dopant region to form a first plurality of epitaxial silicon-germanium/silicon regions, the first plurality of silicon-germanium/silicon regions having a higher acceptor concentration than either of the first dopant regions;

depositing silicon-germanium and silicon over the second source dopant region and the second drain dopant region to form a second plurality of epitaxial silicon-germanium/silicon regions, the second plurality of silicon-germanium/silicon regions having a higher donor concentration than either of the second dopant regions;

fabricating a PMOS transistor from the first drain dopant region and the first source dopant region, the PMOS transistor configured to serve as a select transistor in a memory cell;

fabricating an NMOS transistor from the second drain dopant region, the gate dopant region, the second source dopant region, and the floating gate region, the NMOS transistor configured to serve as a memory transistor in the memory cell;

coupling the first drain dopant region and the second drain dopant region to serve as an electronic storage cell; and fabricating at least one bipolar device in the integrated circuit, the at least one bipolar devices being in electrical communication with the select transistor and the memory transistor and having a breakdown voltage sufficient to withstand a programming voltage of the memory cell.

12. The method of fabricating the integrated circuit of claim 11, wherein the n-well is produced by depositing an epitaxial layer on the uppermost surface of the semiconducting substrate and doping the epitaxial layer so as to have a higher concentration of donor sites than a concentration of dopant sites of the semiconducting substrate.

13. The method of fabricating the integrated circuit of claim 11, wherein the p-well is produced by depositing an epitaxial layer on the uppermost surface of the semiconducting substrate and doping the epitaxial layer so as to have a higher concentration of acceptor sites than a concentration of dopant sites of the semiconducting substrate.

14. The method of fabricating the integrated circuit of claim 11, wherein the n-well is produced by doping at least a portion of an uppermost surface of the semiconducting substrate so as to have a higher concentration of donor sites than a concentration of dopant sites of the semiconducting substrate.

15. The method of fabricating the integrated circuit of claim 11, wherein the p-well is produced by doping at least a portion of an uppermost surface of the semiconducting substrate so as to have a higher concentration of acceptor sites than a concentration of dopant sites of the semiconducting substrate.

16. The method of fabricating the integrated circuit of claim 11 further comprising producing collector, base, and emitter regions for at least one NPN or PNP transistor from the second plurality of silicon-germanium/silicon regions.

17. The method of fabricating the integrated circuit of claim 11 further comprising a tunnel diode window, wherein the tunnel diode window is located in proximity to the doped gate dopant region and an oxide in the tunnel diode window is about 7 nanometers in thickness.

18. The method of fabricating the integrated circuit of claim 11, wherein the first source dopant region, the first drain dopant region, the second drain dopant region, the second source dopant region, and the gate dopant region are all doped to a depth of about 100 nm.

19. A method of fabricating an integrated circuit comprising:

producing an n-well into an uppermost surface of a semiconducting substrate, the n-well being produced by depositing a first epitaxial layer on the uppermost surface of the semiconducting substrate, the first epitaxial layer is doped so as to have a higher concentration of donor sites than a concentration of dopant sites of the semiconducting substrate;

producing a p-well into the uppermost surface of the semiconducting substrate, the p-well being produced by depositing a second epitaxial layer on the uppermost surface of the semiconducting substrate, the second epitaxial layer is doped so as to have a higher concentration of acceptor sites than the concentration of dopant sites of the semiconducting substrate;

doping a first source dopant region and a first drain dopant region into the n-well, the first drain dopant region and the first source dopant region being lightly doped acceptor sites;

doping a second source dopant region and a second drain dopant region into the p-well, the second drain dopant region and the second source dopant region being lightly doped donor sites;

doping a gate dopant region within the p-well and coupled to the second drain dopant region, the gate dopant region having a higher concentration of donor sites than either of the second dopant regions;

depositing a floating gate region in proximity to the gate dopant region, the floating gate region configured as a floating programming gate;

depositing silicon-germanium and silicon over the first source dopant region and the first drain dopant region to form a first plurality of epitaxial silicon-germanium/silicon regions, the first plurality of silicon-germanium/silicon regions having a higher acceptor concentration than either of the first dopant regions;

depositing silicon-germanium and silicon over the second source dopant region and the second drain dopant region to form a second plurality of epitaxial silicon-germanium/silicon regions, the second plurality of silicon-germanium/silicon regions having a higher donor concentration than either of the second dopant regions;

fabricating a PMOS transistor from the first drain dopant region and the first source dopant region, the PMOS transistor configured to serve as a select transistor in a memory cell;

fabricating an NMOS transistor from the second drain dopant region, the gate dopant region, the second source dopant region, and the floating gate region, the NMOS transistor configured to serve as a memory transistor in the memory cell;

coupling the first drain dopant region and the second drain dopant region to serve as an electronic storage cell; and producing collector, base, and emitter regions from the second plurality of silicon-germanium/silicon regions for at least one NPN or PNP transistor in electrical communication with the select transistor and the memory transistor.

20. The method of fabricating the integrated circuit of claim 19, wherein the first source dopant region, the first drain dopant region, the second source dopant region, the second drain dopant region, and the gate dopant region are all doped to a depth of about 100 nm.

21. A method of fabricating an integrated circuit comprising:

producing an n-well into an uppermost surface of a semiconducting substrate, the n-well being produced by doping at least a portion of an uppermost surface of the semiconducting substrate so as to have a higher concentration of donor sites than a concentration of dopant sites of the semiconducting substrate;

producing a p-well into the uppermost surface of the semiconducting substrate, the p-well being produced by doping at least a portion of the uppermost surface of the semiconducting substrate so as to have a higher concentration of acceptor sites than the concentration of dopant sites of the semiconducting substrate;

doping a first source dopant region and a first drain dopant region into the uppermost surface of the semiconducting substrate within the n-well, the first drain dopant region and the first source dopant region being lightly doped acceptor sites;

doping a second source dopant region and a second drain dopant region into the uppermost surface of the semiconducting substrate within the p-well, the second drain dopant region and the second source dopant region being lightly doped donor sites;

doping a gate dopant region within the p-well and coupled to the second drain dopant region, the gate dopant region having a higher concentration of donor sites than either of the second dopant regions;

depositing a floating gate region in proximity to the gate dopant region, the floating gate region configured as a floating programming gate;

depositing silicon-germanium and silicon over the first source dopant region and the first drain dopant region to form a first plurality of epitaxial silicon-germanium/silicon regions, the first plurality of silicon-germanium/silicon regions having a higher acceptor concentration than either of the first dopant regions;

depositing silicon-germanium and silicon over the second source dopant region and the second drain dopant region to form a second plurality of epitaxial silicon-germanium/silicon regions, the second plurality of silicon-germanium/silicon regions having a higher donor concentration than either of the second dopant regions;

fabricating a PMOS transistor from the first drain dopant region and the first source dopant region, the PMOS transistor configured to serve as a select transistor in a memory cell;

fabricating an NMOS transistor from the second drain dopant region, the gate dopant region, the second source dopant region, and the floating gate region, the NMOS transistor configured to serve as a memory transistor in the memory cell;

coupling the first drain dopant region and the second drain dopant region to serve as an electronic storage cell; and producing collector, base, and emitter regions from the second plurality of silicon-germanium/silicon regions for at least one NPN or PNP transistor in electrical communication with the select transistor and the memory transistor.

22. The method of fabricating the integrated circuit of claim 11, wherein the first source dopant region, the first drain dopant region, the second source dopant region, the second drain dopant region, and the gate dopant region are all doped to a depth of about 100 nm.

23. A method of fabricating an integrated circuit comprising:

producing an n-well into an uppermost surface of a semiconducting substrate, the n-well being produced by depositing a first epitaxial layer on the uppermost surface of the semiconducting substrate, the first epitaxial layer is doped so as to have a higher concentration of donor sites than a concentration of dopant sites of the semiconducting substrate;

producing a p-well into the uppermost surface of the semiconducting substrate, the p-well being produced by depositing a second epitaxial layer on the uppermost surface of the semiconducting substrate, the second epitaxial layer is doped so as to have a higher concentration of acceptor sites than the concentration of dopant sites of the semiconducting substrate;

doping a first source dopant region and a first drain dopant region into the n-well, the first drain dopant region and the first source dopant region being lightly doped acceptor sites;

doping a second source dopant region and a second drain dopant region into the p-well, the second drain dopant region and the second source dopant region being lightly doped donor sites;

doping a gate dopant region within the p-well and coupled to the second drain dopant region, the gate dopant region having a higher concentration of donor sites than either of the second dopant regions;

depositing a floating gate region in proximity to the gate dopant region, the floating gate region configured as a floating programming gate;

depositing silicon-germanium and silicon over the first source dopant region and the first drain dopant region to form epitaxial silicon-germanium/silicon regions, the silicon-germanium/silicon regions having a higher acceptor concentration than either of the first dopant regions;

depositing silicon over the second source dopant region and the second drain dopant region to form emitter polysilicon regions, the emitter polysilicon regions having a higher donor concentration that either of the second dopant regions;

fabricating a PMOS transistor from the first drain dopant region and the first source dopant region, the PMOS transistor configured to serve as a select transistor in a memory cell;

fabricating an NMOS transistor from the second drain dopant region, the gate dopant region, the second source dopant region, and the floating gate region, the NMOS transistor configured to serve as a memory transistor in the memory cell;

coupling the first drain dopant region and the second drain dopant region to serve as an electronic storage cell; and producing collector, base, and emitter regions from the emitter polysilicon regions for at least one NPN or PNP transistor in electrical communication with the select transistor and the memory transistor.

24. The method of fabricating the integrated circuit of claim 23, wherein the first source dopant region, the first drain dopant region, the second source dopant region, the second drain dopant region, and the gate dopant region are all doped to a depth of about 100 nm.

25. A method of fabricating an integrated circuit comprising:

producing an n-well into an uppermost surface of a semiconducting substrate, the n-well being produced by doping at least a portion of the uppermost surface of the semiconducting substrate so as to have a higher concentration of donor sites than a concentration of dopant sites of the semiconducting substrate;

producing a p-well into the uppermost surface of the semiconducting substrate, the p-well being produced by doping at least a portion of the uppermost surface of the semiconducting substrate so as to have a higher concentration of acceptor sites than the concentration of dopant sites of the semiconducting substrate;

doping a first source dopant region and a first drain dopant region into the uppermost surface of the semiconducting substrate within the n-well, the first drain dopant region and the first source dopant region being lightly doped acceptor sites;

doping a second source dopant region and a second drain dopant region into the uppermost surface of the semiconducting substrate within the p-well, the second drain dopant region and the second source dopant region being lightly doped donor sites;

doping a gate dopant region within the p-well and coupled to the second drain dopant region, the gate dopant region having a higher concentration of donor sites than either of the second dopant regions;

depositing a floating gate region in proximity to the gate dopant region, the floating gate region configured as a floating programming gate;

depositing silicon-germanium and silicon over the first source dopant region and the first drain dopant region to form epitaxial silicon-germanium/silicon regions, the silicon-germanium/silicon regions having a higher acceptor concentration than either of the first dopant regions;

depositing silicon over the second source dopant region and the second drain dopant region to form emitter polysilicon regions, the emitter polysilicon regions having a higher donor concentration that either of the second dopant regions;

fabricating a PMOS transistor from the first drain dopant region and the first source dopant region, the PMOS transistor configured to serve as a select transistor in a memory cell;

fabricating an NMOS transistor from the second drain dopant region, the gate dopant region, the second source dopant region, and the floating gate region, the NMOS transistor configured to serve as a memory transistor in the memory cell;

coupling the first drain dopant region and the second drain dopant region to serve as an electronic storage cell; and producing collector, base, and emitter regions from the emitter polysilicon regions for at least one NPN or PNP transistor in electrical communication with the select transistor and the memory transistor.

26. The method of fabricating the integrated circuit of claim 25, wherein the first source dopant region, the first drain dopant region, the second source dopant region, the second drain dopant region, and the gate dopant region are all doped to a depth of about 100 nm.

* * * * *

UNITED STATES PATENT AND TRADEMARK OFFICE
CERTIFICATE OF CORRECTION

PATENT NO. : 7,091,075 B2
APPLICATION NO. : 10/887990
DATED : August 15, 2006
INVENTOR(S) : Muhammad I. Chaudhry It is certified that error appears in the above-identified patent and that said Letters Patent is hereby corrected as shown below:

Column 12, claim 22, lines 26-27: "… integrated circuit of claim 11, wherein the first source …" should read:
--…integrated circuit of claim 21, wherein the first source… --.

Signed and Sealed this

Twenty-sixth Day of December, 2006

JON W. DUDAS
*Director of the United States Patent and Trademark Office*